(12) United States Patent
Lappoehn

(10) Patent No.: US 7,901,248 B2
(45) Date of Patent: Mar. 8, 2011

(54) PLUG CONNECTOR AND MULTILAYER BOARD

(75) Inventor: Juergen Lappoehn, Gammelshausen (DE)

(73) Assignee: ERNI Electronics GmbH, Adelberg (DE)

( * ) Notice: Subject to any disclaimer, the term of this patent is extended or adjusted under 35 U.S.C. 154(b) by 0 days.

(21) Appl. No.: 12/386,641

(22) Filed: Apr. 21, 2009

(65) Prior Publication Data

US 2010/0178802 A1    Jul. 15, 2010

(30) Foreign Application Priority Data

Jan. 12, 2009   (DE) .......................... 10 2009 004 684

(51) Int. Cl.
*H01R 13/648* (2006.01)
(52) U.S. Cl. ................................................. 439/607.05
(58) Field of Classification Search ............ 439/607.05, 439/701, 79, 607.07, 607.56, 607.06, 108
See application file for complete search history.

(56) References Cited

U.S. PATENT DOCUMENTS

| 4,335,364 | A | 6/1982 | Schmitz et al. | 333/33 |
| 6,129,591 | A | 10/2000 | Czeschka | 439/680 |
| 6,394,822 | B1 | 5/2002 | McNamara | 439/108 |
| 6,899,566 | B2 * | 5/2005 | Kline et al. | 439/607.56 |
| 6,976,886 | B2 | 12/2005 | Winings et al. | 439/701 |

FOREIGN PATENT DOCUMENTS

| DE | 29 49 013 | 6/1981 |
| DE | 39 04 461 | 9/1990 |
| DE | 39 36 466 | 5/1991 |
| DE | 198 07 713 | 6/1999 |
| DE | 699 15 882 | 3/2005 |

* cited by examiner

*Primary Examiner* — Javaid Nasri
(74) *Attorney, Agent, or Firm* — Collard & Roe, P.C.

(57) ABSTRACT

A multipolar plug connector for establishing contact with a multilayer board includes signal contacts that are assigned a first and at least one second screen contact element and are arranged adjacent to the signal contact. Recesses are provided at least on the uppermost Layer of the multilayer board which are suitably sized so as to receive and to lead through at least two screen contact elements assigned to neighboring signal contacts.

11 Claims, 7 Drawing Sheets

PLUG CONNECTOR AND MULTILAYER BOARD

CROSS REFERENCE TO RELATED APPLICATIONS

Applicant claims priority under 35 U.S.C. §119 of German Application No. 10 2009 004 684.4 filed on Jan. 12, 2009.

The present invention relates to a multipolar plug connector for establishing contact with a multilayer board as defined in the preamble of the independent claim.

PRIOR ART

DE 699 15 882 T2 describes a plug connector suited for high-frequency data transmission. Each signal contact element is assigned a screen or mass contact element. The orientation of the contact elements is selected so as to allow impedance matching.

U.S. Pat. No. 6,976,886 B2 describes a plug connector by which a high screening effect between the signal lines one relative to the other, and of the plug connector generally is to be achieved, by a special arrangement and/or orientation of the signal and screen contact elements one relative to the other. The known plug connector is especially well suited for high-frequency signals, and in addition the arrangement of the signal and mass contact elements is especially defined so that a specific surge impedance is provided.

The multipolar high-frequency plug connection described by DE 39 36 466 A1 comprises a plug connector having a metallic screen that is connected with two contact elements intended for contact-making with a circuit board. The two mass contact elements are arranged on both outer surfaces of the plug connector. The screen is not especially assigned to a selected signal contact element.

DE 29 49 013 A2 describes a frequency-optimized connector between a coaxial cable and a circuit board. The neutral conductor of one coaxial cable is connected with a strip conductor arranged on a board. Screening of the coaxial cable results in a mass surface which, in the area of the signal strip conductor, is subdivided into two mass conductor strips arranged adjacent to the signal conductor strip. At the other end of the board, a multipolar plug connector is fixed on the board by soldering. A plug connector contact element is soldered to the signal strip conductors. At the side of the signal contact element four neighboring contact elements are soldered to the mass surface of the strip conductor arrangement.

DE 39 04 461 C1 and DE 39 36 466 A1 describe multipolar high-frequency plug connectors where at least one of the corresponding plug connectors comprises a metallic screen connected with two contact elements intended for establishing contact with a circuit board. The two mass contact elements are arranged on both outer surfaces of the plug connector.

DE 198 07 713 A1 describes a plug connector comprising a large number of contact elements. The known plug connector is intended to establish plug connections between backplanes and plug-in cards of what is known as compact PCI systems.

Now, it is the object of the present invention to provide a plug connector for establishing contact with a multilayer board, in combination with a multilayer board, which together allow efficient screening up to the upper high frequency range.

This object is achieved by the features defined in the independent claim.

DISCLOSURE OF THE INVENTION

The multipolar plug connector for establishing contact with a multilayer board, which comprises signal contacts that are assigned a first and at least one second screen contact element and are arranged adjacent to the signal contact, distinguishes itself by the fact that recesses are provided at least on the upper layer of the multilayer board which are suitably sized so as to receive and lead through at least two screen contact elements assigned to neighboring signal contacts.

It was found by simulation that distributing the screening to at least two screen contact elements assigned to one signal contact considerably improves the screen rate compared with a single screen contact element. In order to adapt the multilayer board to a plug connector, the multilayer board is provided with through-holes that are properly sized to receive and to lead through the at least two screen contact elements.

Further, by assigning at least two screen contact elements to each of the signal contacts, uniform local inductivity is achieved within the plug connector, and within the multilayer board as well. Correspondingly, the characteristic or surge impedance is homogeneously distributed within the plug connector and within the multilayer board.

Due to that arrangement, the plug connector, in combination with the multilayer board equipped with the plug connector, is generally suited for carrying signal frequencies up to the upper GHz range. The simulation results could be confirmed by experiments.

Advantageous embodiments and further developments of the plug connector according to invention for establishing contact to a multilayer board, in combination with an especially designed multilayer board, are apparent from the dependent claims.

One embodiment provides that the signal contact which is screened by at least two screen contact elements comprises a pair of signal contact elements which, according to a further development of that embodiment, are suitably connected for carrying differential signals.

Another embodiment provides that an electrically conductive screening ring is provided at least in the area of the rear outlet of the contact elements from the plug connector housing, which ring encloses, at least in part, the signal contact to be screened. That feature is suitable to improve the screening effect especially when the screening ring is in contact with the first and the second screen contact element, as provided by a further development of that embodiment. According to another further development of that embodiment, a plurality of screening rings may be connected one with the other.

One embodiment provides that the screen contact elements assigned to one signal contact, as well the at least one signal contact element of the signal contact, are arranged one beside the other in a row and/or a column of the plug connector, at least approximately. The uniform geometric arrangement increases the homogeneity of the surge impedance within the plug connector, including the multilayer board equipped with the plug connector.

According to another embodiment, the screen contact elements are in contact with mass surfaces provided on one or more layers of the multilayer board, in which case the mass surfaces may be subdivided into a plurality of partial areas in order to influence the screening effect and/or the surge impedance as required.

A preferred use of the plug connector with the multilayer board provided for contact-making provides for the use of the multilayer board as a backplane. Details in this respect can be derived from the cited prior art as known from DE 198 07 713 A1.

A further development provides that the plug connector is assembled from segments that contain the signal contacts and screen contact elements arranged in a row or column one beside the other. The different segments may comprise a screening sheet at least on one side. Those features allow easy production of the plug connector.

Another further development provides that the multilayer board comprises at least a single continuous recess intended to receive and to lead through a pair of signal contact elements. Production of the multilayer board is rendered especially easy if instead of certain individual recesses intended to receive and to lead through each pair of signal contact elements, such receiving and lead-through recesses are provided for every pair of signal contact elements.

Other advantageous further developments and embodiments of the plug connector provided for establishing contact with the multilayer board, including the multilayer board, may be derived from the embodiments described in the following, and from the drawings.

SHORT DESCRIPTION OF THE DRAWING

DETAILED DESCRIPTION OF THE EMBODIMENTS

Figure 1:
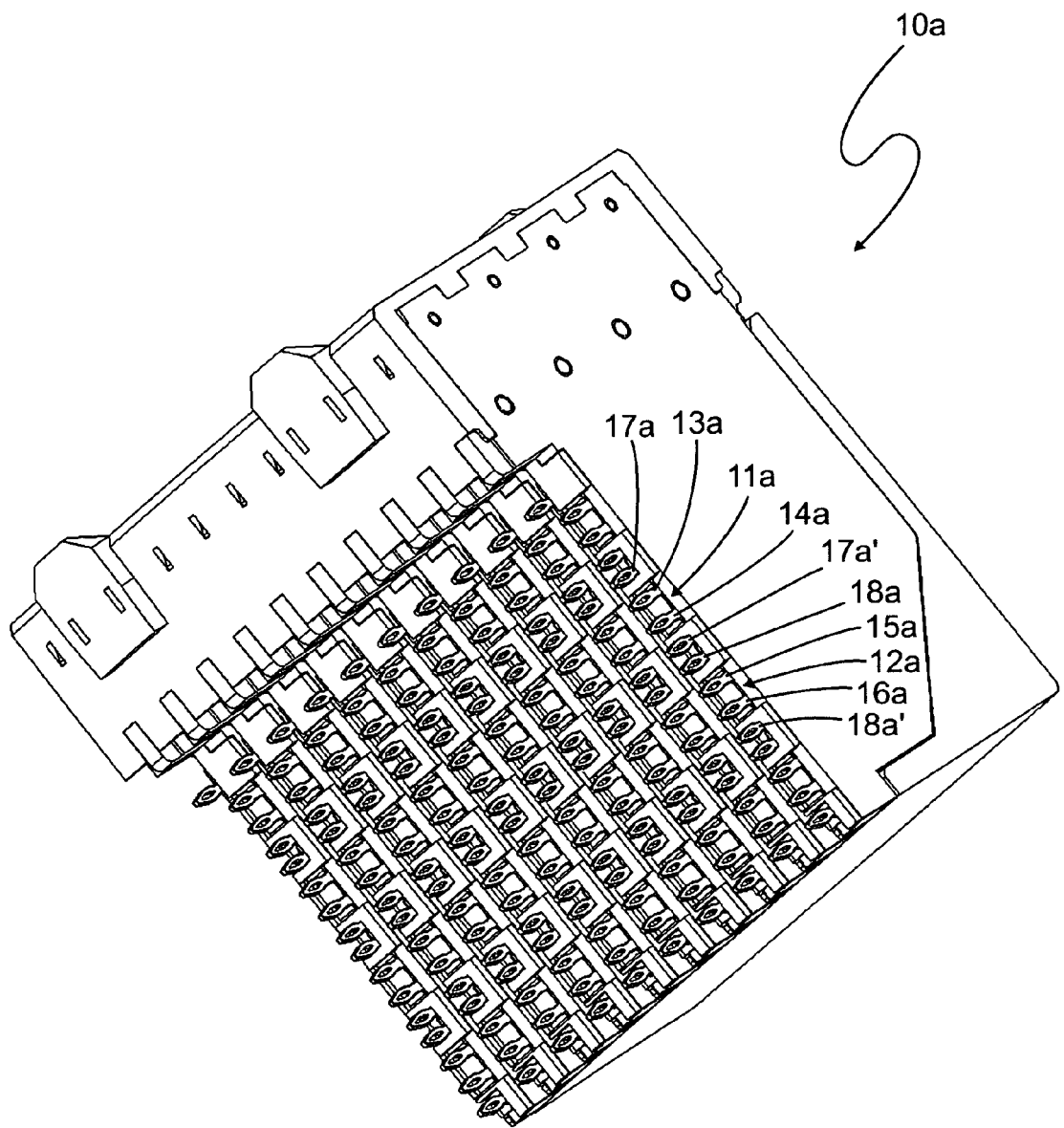
FIG. 1 shows a three-dimensional representation of a plug connector showing especially a view of the contact-making ends of the contact element.

FIG. 1 shows a three-dimensional representation of a multipolar plug connector 10a, providing a view especially of the rear ends of contact elements intended for making contact with a multilayer board not shown in FIG. 1. A first signal contact 11a and a neighboring signal contact 12a are arranged in one row or column, by way of example. One signal contact may comprise one or more signal contact elements. Contact between the multipolar plug connector 10a and the multilayer board preferably is established by press-in connection. Alternatively, or additionally, soldering may be used.

In the illustrated embodiment the first signal contact 11a comprises a first and a second signal contact element 13a, 14a, and the neighboring signal contact 12a likewise comprises a first and a second signal contact element 15a, 16a.

Accordingly, both signal contacts 11a, 12a are implemented as pairs of signal contact elements by way of example.

At least certain selected signal contacts 11a, 12a of the plug connector 10a should be screened. Screening is effected by screen contact elements. Instead of assigning one signal contact a single screen contact element only, it is provided to assign the signal contacts a first and at least one second screen contact element. In the illustrated embodiment, the first signal contact 11a is assigned a first screen contact element 17a and at least one second screen contact element 17a', the first screen contact element 17a being arranged on the one side of the signal contact 11a and the other screen contact element 17a' being arranged on the other side of the signal contact 11a, so that the signal contact 11a is enclosed by its associated screen contact elements 17a, 17a' at least in part.

The first screen contact element 18a and the at least one second screen contact element 18a' are assigned to the neighboring signal contact 12a.

Figure 2:
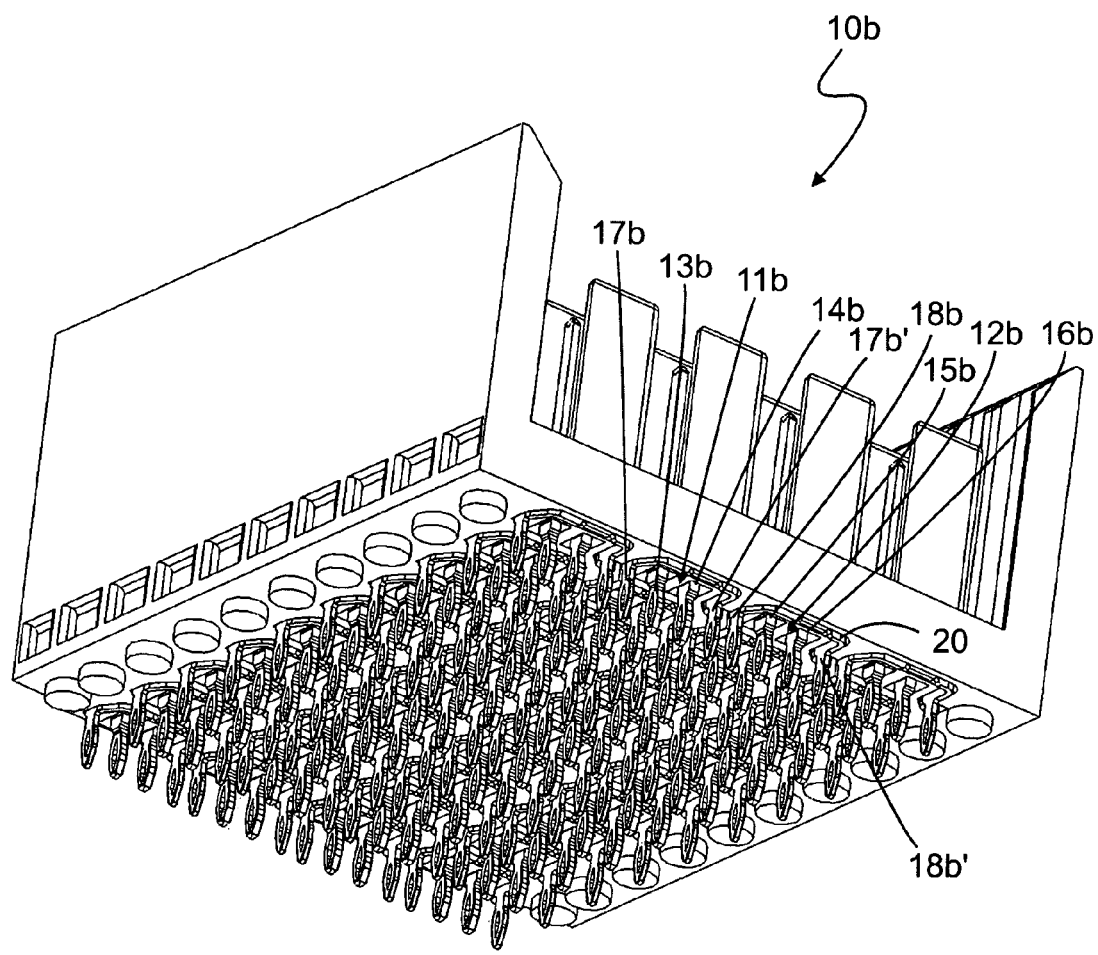
FIG. 2 shows a three-dimensional view of a corresponding plug connector, likewise providing a view of the contact-making ends of the contact elements.

FIG. 2 shows a plug connector 10b corresponding to the plug connector 10a shown in FIG. 1. While the plug connector 10a shown in FIG. 1 comprises spring contacts, for example, the corresponding plug connector 10b shown in FIG. 2 is equipped with the matching blade contacts. Those parts in FIG. 2 that correspond to the parts illustrated in FIG. 1 are indicated by the same reference numerals, with the index "a" replaced by index "b". That convention will be followed also in the description of the following Figures.

The corresponding plug connector 10b illustrated in FIG. 2 shows an embodiment using a screening ring 20 that encloses the signal contacts 11b, 12b at least in part. The screening ring 20 exists at least in the area of the rear portion of the plug connector 10b which is intended to establish contact with the multi-layer board. Additionally or alternatively, the screening ring 20 may also be provided in the inner area of the plug connector 10b. Of course such a screening ring may also be provided in the plug connector 10a configured according to FIG. 1.

Figure 3:
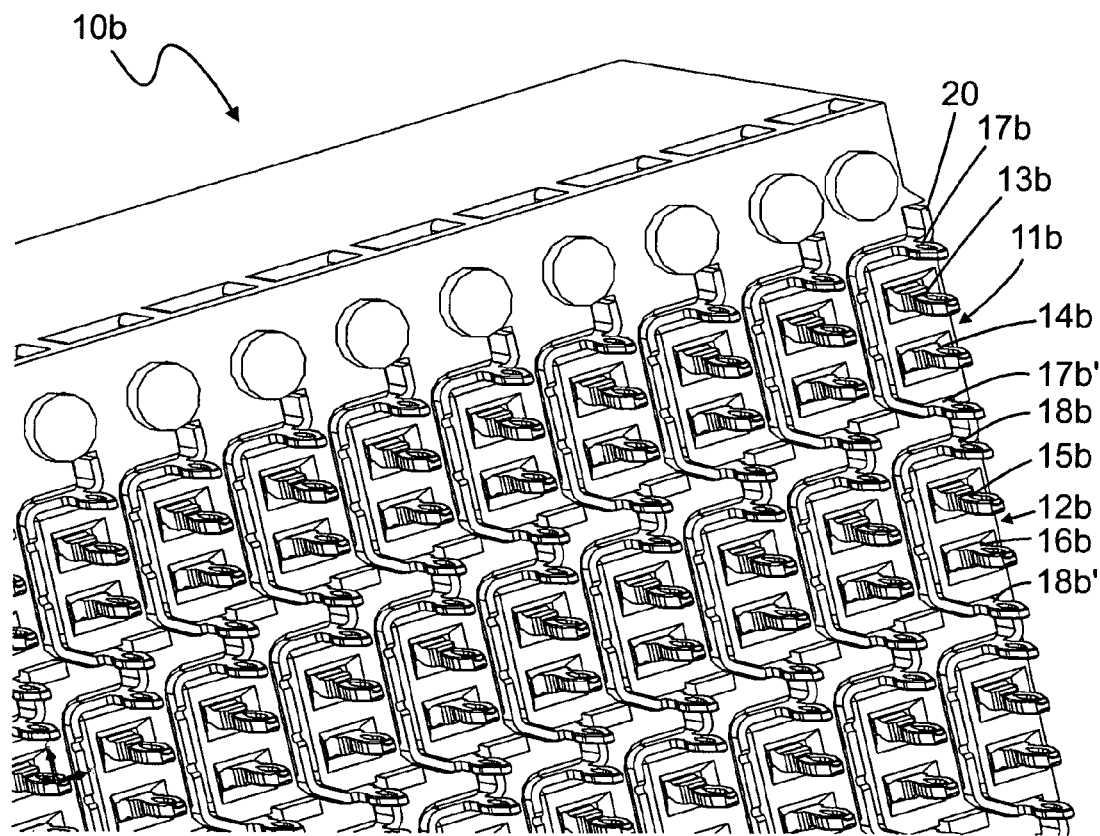
FIG. 3 shows a detail of the representation of FIG. 2.

FIG. 3 shows a detail of FIG. 2 viewed from a different perspective. Especially, FIG. 3 shows another configuration which provides that the screening ring 20, enclosing the signal contacts 11b, 12b at least in part, interconnects the screen contact elements 17b, 17b'; 18b, 18b' associated with the signal contact 11b, 12b. In addition, there can be seen another embodiment which provides that the screen contact elements 17b, 17b'; 18b, 18b' of a plurality of signal contacts 11b, 12b are interconnected by the screening ring 20.

Figure 4:
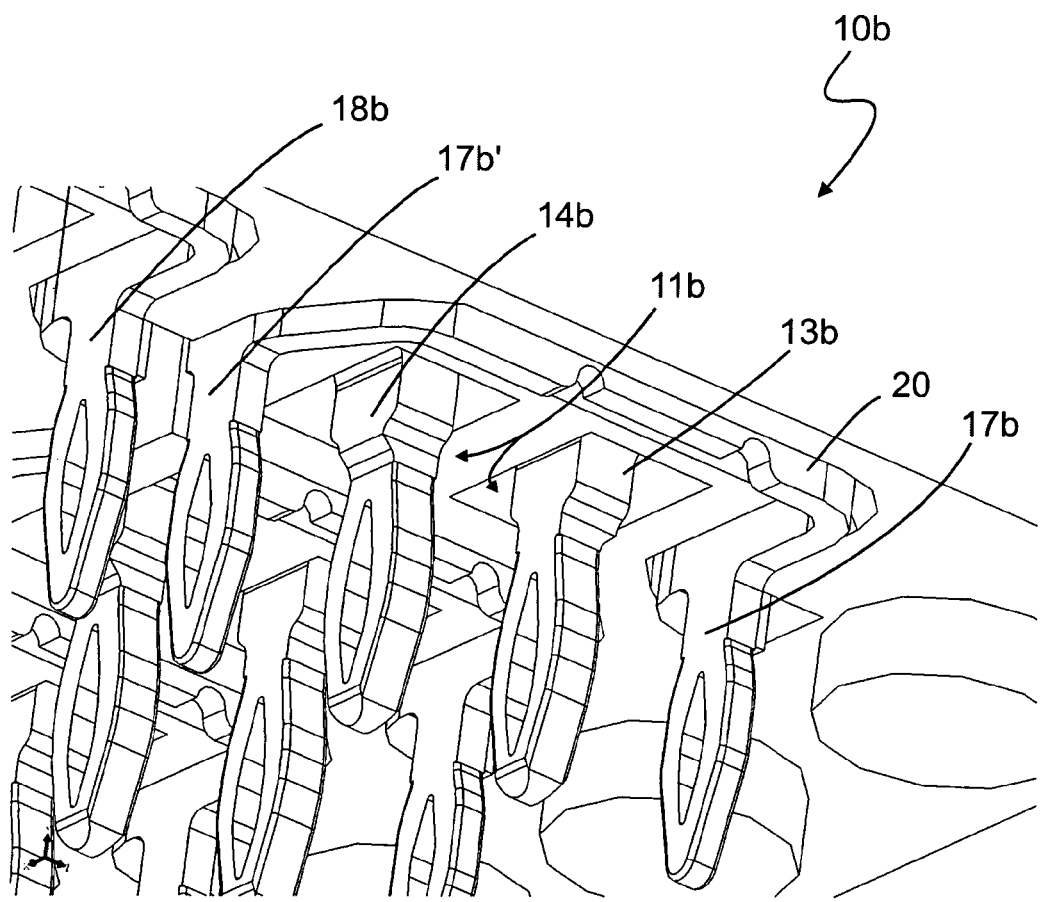
FIG. 4 shows a greatly enlarged detail of the representation of FIG. 2.

FIG. 4 shows a greatly enlarged detail of FIG. 2 in which the screening ring 20 can be seen with particular clarity. In this embodiment, too, the screen contact elements 17b, 17b' assigned to one signal contact 11b are interconnected in an electrically conductive manner by the screening ring 20. In addition, that Figure likewise shows the embodiment where the screening ring 20 interconnects the screen contact elements 17b, 17b', 18b respectively assigned to neighboring signal contacts.

Figure 5:
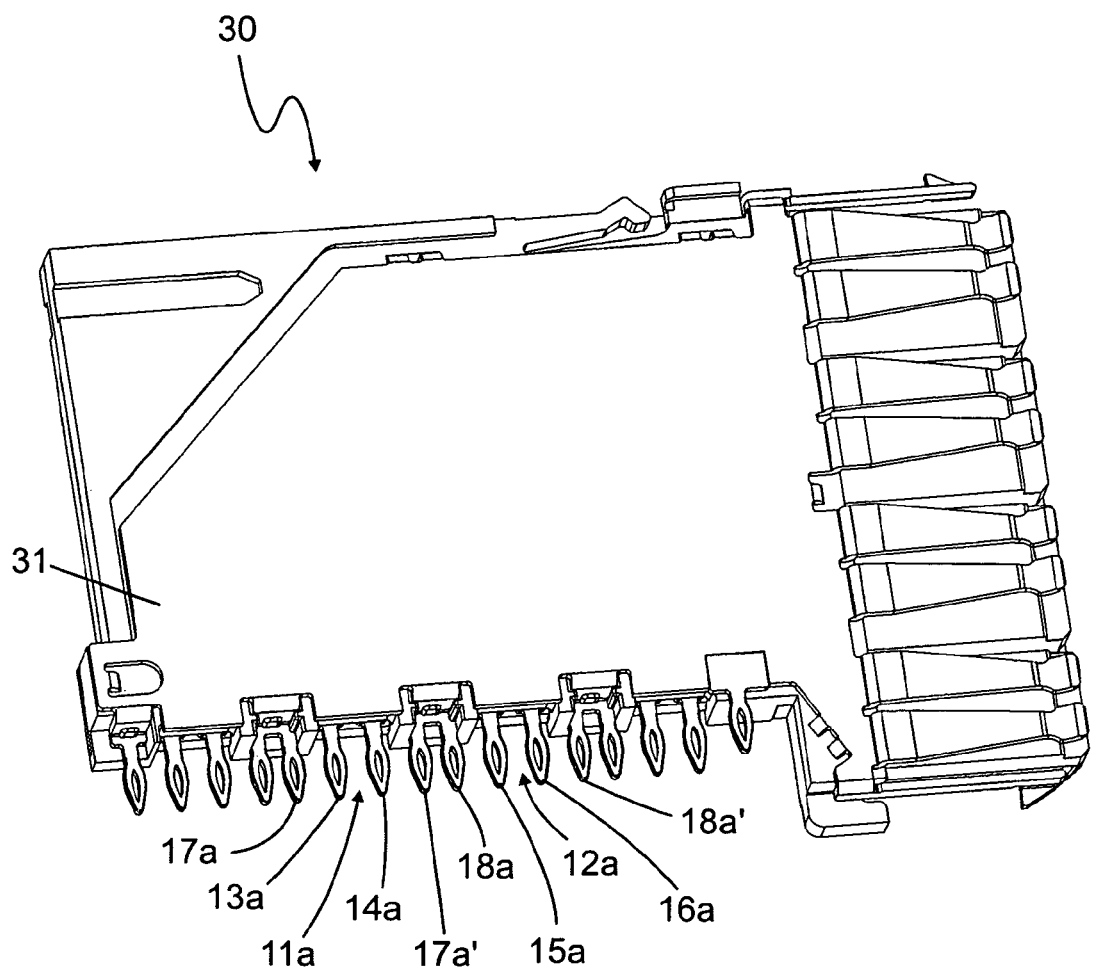
FIG. 5 shows a segment of the plug connector shown in FIG. 1.

FIG. 5 shows one segment 30 of the plug connector 10a illustrated in FIG. 1. The design by segments allows the plug connector 10a to be formed from a plurality of segments 30 arranged in series. This allows the production of the plug connector 10a to be considerably facilitated. FIG. 5 shows a screening sheet 31 which covers all contact elements 13a, 13b, 14a, 14b, 15a, 15b; 16a, 16b; 17a; 17b, 17a', 17b'; 18a, 18b, 18a', 18b', thereby screening them from the neighboring corresponding contact elements of the next segment 30, not shown in the drawing.

Figure 6:
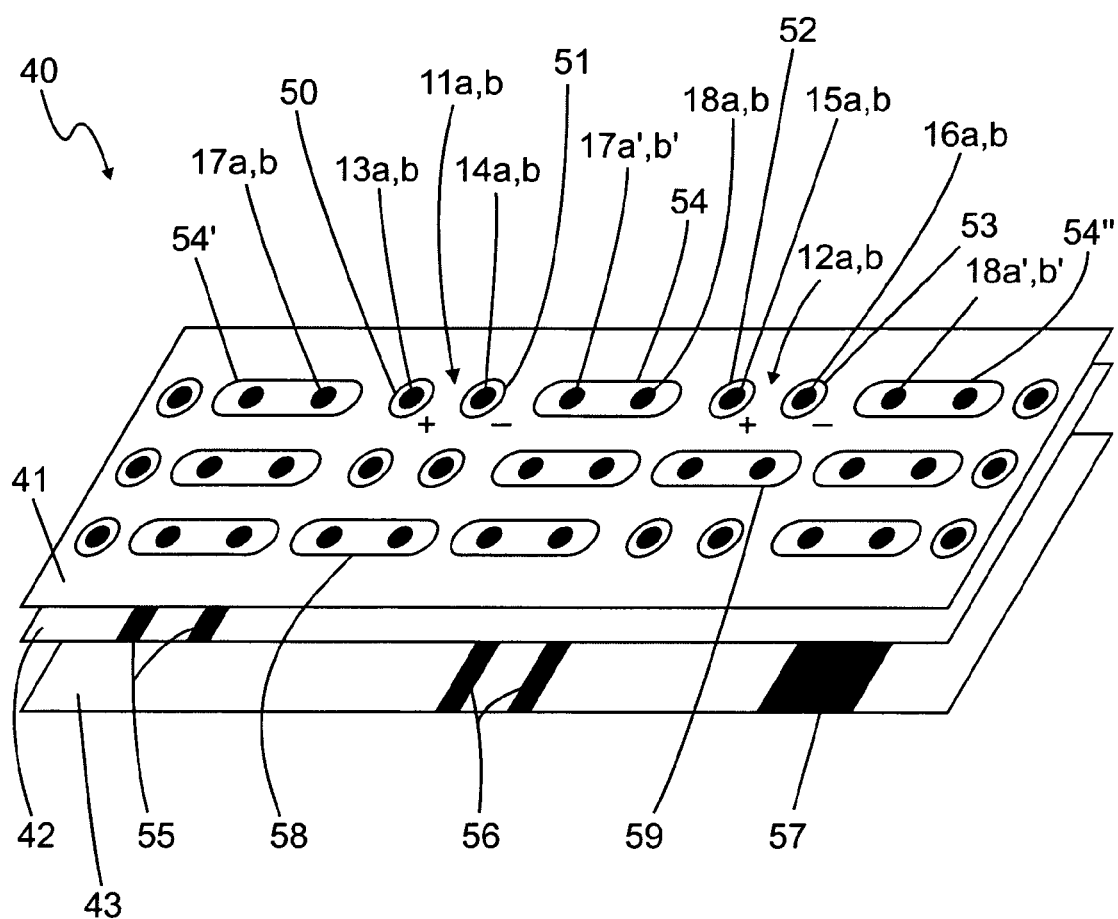
FIG. 6 shows an isometric diagrammatic representation of a multilayer board with a first configuration of recesses for contact elements.

FIG. 6 shows a first embodiment of a multilayer board 40 comprising a plurality of layers 41, 42, 43. The multilayer board 40 is prepared for contact-making with the plug connector 10b according to FIG. 1, or with the plug connector 10b according to FIG. 2. Accordingly, those parts that correspond to the parts illustrated in FIGS. 1 and 2 are again indicated by the same reference numerals. The representation of FIG. 6 corresponds to a section along the surface of the uppermost layer 41 of the multilayer board 40 with assembled plug connector 10a, 10b.

Accordingly, there can be seen in the drawing only those parts of the contact elements 13a, 13b, 14a, 14b; 15a, 15b, 16a, 16b; 17a, 17a', 17b'; 18a, 18b, 18a', 18b' that are located in the multilayer board 40. The signal contact elements 13a, 13b, 14a, 14b; 15a, 15b, 16a, 16b are respectively located in the recesses 50, 51, 52, 53. The screen contact elements 17a', 17b', 18a, 18b, which are assigned to neighboring signal contacts 11a, 11b; 12a, 12b, are located in a single continuous recess 54, 54', 54'' according to the invention.

The screen contact elements 17a, 17b, 17a', 17b'; 18a, 18b, 18a', 18b' are preferably in contact with mass surfaces 55, 56, 57 that may be arranged on different layers 41, 42, 43 of the multilayer board 40. Contact is made preferably by a press-in connection in this case as well. Alternatively or additionally, soldering may be applied. The dimensions of the mass surfaces 55, 56, 57 may vary depending on the particular requirements. For example, the mass surface 55 arranged on the second layer 42, and the mass surface 56 arranged on the lowermost layer 42 are subdivided into several partial areas.

According to one embodiment, the two signal contact elements 13a,13b, 14a, 14b; 15a, 15b, 16a, 16b, which respectively form a signal contact 11a, 11b; 12a, 12b, are interconnected in the form of differential contact pairs where one signal contact element 13a, 13b; 15a, 15b carries a first signal pattern related to a reference potential, while the second signal contact element 14a, 14b; 16a, 16b of the signal contact 11a, 11b; 12a, 12b carries an inverted signal pattern. For greater clarity, the one signal contact element 13a, 13b; 15a, 15b is designated by a plus sign while the other signal contact element 14a, 14b; 16a, 16b is designated by a minus sign.

FIG. 6 shows a further embodiment according to which the two signal contact elements 13a, 13b, 14a, 14b; 15a, 15b, 16a, 16b of at least certain individual signal contacts 11a, 11b; 12a, 12b are likewise arranged in a continuous recess 58, 59.

The recesses 54, 54'; 54'', 58, 59 are provided at least in the uppermost layer 41 of the multilayer board 40 and, if required, also in lower layers 42, 43.

Figure 7:
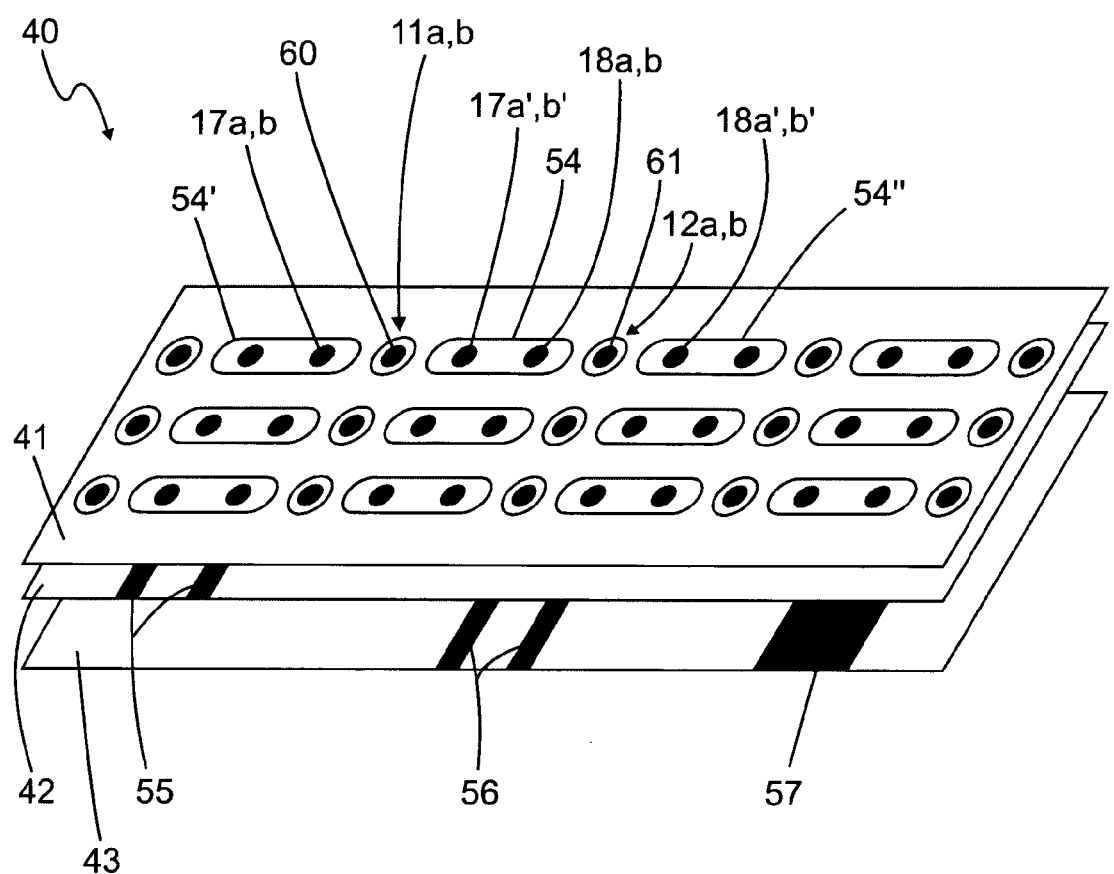
FIG. 7 shows an isometric diagrammatic representation of a multilayer board with a second configuration of recesses for contact elements.

FIG. 7 shows another embodiment of the multilayer board 40 which likewise comprises a plurality of layers 41, 42, 43. For contact-making the multilayer board 40 is provided with an embodiment of the plug connector 10a, 10b where the signal contact 11a, 11b; 12a, 12b comprises only a single signal contact element 60, 61 each. The further embodiments may be configured in accordance with the multilayer board 40 shown in FIG. 6.

In principle it is possible, though with increased production input, to configure the plug connector 10a, 10b and the multilayer board 40 to be contacted in such a way that part of the signal contact elements 13a, 13b, 14a, 14b; 15a, 15b, 16a, 16b of the signal contacts 11a, 1 1b; 12a, 12b contain only a single signal contact element 60, 61 while another part of the signal contact elements 11a, 11b; 12a, 12b contain pairs of signal contact elements 13a, 13b, 14a, 14b; 15a, 15b, 16a, 16b.

The invention claimed is:

1. An assembly comprising:
   a multilayer board and a multipolar plug connector for establishing contact with said multilayer board; said multipolar plug connector comprising a plurality of signal contacts and a plurality of screen contact elements;
   wherein said plurality of signal contacts comprises a first signal contact and a second signal contact neighboring said first signal contact, said first signal contact comprising a first pair of signal contact elements comprising a first signal contact element and a second signal contact element and said second signal contact comprising a second pair of signal contact elements comprising a third signal contact element and a fourth signal contact element;
   wherein said plurality of screen contact elements comprises a first screen contact element arranged adjacent said first signal contact element for screening said first signal contact, a second screen contact element arranged adjacent said second signal contact element for screening said first signal contact, a third screen contact element arranged adjacent said third signal contact element for screening said second signal contact and a fourth screen contact element arranged adjacent said fourth signal contact element for screening said second signal contact; and
   wherein said multilayer board comprises a recess provided on an uppermost layer of said multilayer board, wherein said recess receives said second screen contact element and said third screen contact element.

2. The assembly according to claim 1, wherein said first pair of signal contact elements and said second pair of signal contact elements carry differential signals.

3. The assembly according to claim 1, further comprising an electrically conductive screening ring provided at least in an area of said first pair of signal contact elements, said first screen contact element and said second screen contact element, wherein said screening ring encloses, at least in part, said first signal contact to be screened.

4. The assembly according to claim 3, wherein said screening ring contacts said first screen contact element and said second screen contact element.

5. The assembly according to claim 4, wherein a plurality of screening rings are connected one with the other.

6. The assembly according to claim 1, wherein said first screen contact element, said second screen contact element and said first signal contact element are arranged one beside the other in a row and/or a column of the plug connector, at least approximately.

7. The assembly according to claim 1, wherein said plurality of screen contact elements are in contact with a mass surface provided on one layer of said multilayer board.

8. The assembly according to claim 1, wherein said multipolar plug connector is contacted with said multilayer board used as a backplane.

9. The assembly according to claim 1, wherein said multilayer board further comprises a single continuous recess which receives and leads through said first pair of signal contact elements.

10. The assembly according to claim claim 1, wherein said multipolar plug connector is assembled from segments that contain said plurality of signal contacts and said plurality of screen contact elements arranged in a row or in a column one beside the other.

11. The assembly according to claim 10, wherein said segments each comprise a screening sheet at least on one side.

* * * * *